United States Patent
Hou et al.

(10) Patent No.: US 12,532,531 B2
(45) Date of Patent: *Jan. 20, 2026

(54) INTEGRATED CIRCUIT METAL GATE STRUCTURE AND METHOD OF FABRICATING THEREOF

(71) Applicant: Taiwan Semiconductor Manufacturing Company, Ltd., Hsinchu (TW)

(72) Inventors: Yong-Tian Hou, Singapore (SG); Yuan-Shun Chao, Hsinchu County (TW); Chien-Hao Chen, Chuangwei Township (TW); Cheng-Lung Hung, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 64 days.

This patent is subject to a terminal disclaimer.

(21) Appl. No.: 17/302,689

(22) Filed: May 10, 2021

(65) Prior Publication Data

US 2021/0265479 A1    Aug. 26, 2021

Related U.S. Application Data

(60) Continuation of application No. 16/219,546, filed on Dec. 13, 2018, now Pat. No. 11,004,950, which is a
(Continued)

(51) Int. Cl.
*H01L 29/49* (2006.01)
*H01L 21/28* (2006.01)
(Continued)

(52) U.S. Cl.
CPC .... *H01L 29/4966* (2013.01); *H01L 21/28176* (2013.01); *H01L 21/28229* (2013.01);
(Continued)

(58) Field of Classification Search
CPC . H01L 29/517; H01L 29/513; H01L 29/4966; H01L 29/6659; H01L 29/7833;
(Continued)

(56) References Cited

U.S. PATENT DOCUMENTS 5,231,306 A    7/1993   Meikle et al.
5,348,894 A    9/1994   Gnade et al.
(Continued)

FOREIGN PATENT DOCUMENTS

CN    1949532 A    4/2007

OTHER PUBLICATIONS

Changhwan Choi et al., "Aggressively Scaled UltraThin Undoped HfO2 Gate Dielectric (EOT 0.07 nm) With TaN Gate Electrode Using Engineered Interface Layer", IEEE Electron Device Letters, vol. 26, No. 7, Jul. 2005, pp. 454-457.
(Continued)

*Primary Examiner* — Vongsavanh Sengdara
(74) *Attorney, Agent, or Firm* — Haynes and Boone, LLP

(57) ABSTRACT

A semiconductor device includes a gate dielectric layer and a gate electrode formed on the gate dielectric layer. The gate electrode includes a first metal layer, a second metal layer, and a third metal layer. The first metal layer includes an oxygen-gettering composition. The second metal layer includes oxygen. The third metal layer includes an interface with a polysilicon layer.

18 Claims, 6 Drawing Sheets

Related U.S. Application Data continuation of application No. 14/103,550, filed on Dec. 11, 2013, now Pat. No. 10,164,045, which is a division of application No. 12/264,882, filed on Nov. 4, 2008, now Pat. No. 7,596,620.

(60) Provisional application No. 61/090,674, filed on Aug. 21, 2008.

(51) Int. Cl.
 H01L 29/51 (2006.01)
 H01L 29/66 (2006.01)
 H01L 29/78 (2006.01)

(52) U.S. Cl.
 CPC .......... H01L 29/513 (2013.01); H01L 29/517 (2013.01); H01L 29/6659 (2013.01); H01L 29/7833 (2013.01); H01L 21/28088 (2013.01)

(58) Field of Classification Search
 CPC ......... H01L 21/28176; H01L 21/28229; H01L 21/28088
 See application file for complete search history.

(56) References Cited

U.S. PATENT DOCUMENTS

| | | | |
|---|---|---|---|
| 6,121,139 A | 9/2000 | Chang et al. | |
| 6,300,244 B1 | 10/2001 | Itabashi et al. | |
| 6,645,857 B1 | 11/2003 | Whitefield et al. | |
| 6,673,689 B2 | 1/2004 | Al-Shareef et al. | |
| 6,683,357 B2 | 1/2004 | Hu | |
| 6,794,232 B2 | 9/2004 | Zheng et al. | |
| 6,797,572 B1 | 9/2004 | Jeon et al. | |
| 6,890,838 B2 | 5/2005 | Henley et al. | |
| 7,015,534 B2 | 3/2006 | Colombo | |
| 7,052,943 B2 | 5/2006 | Yamazaki et al. | |
| 7,063,893 B2 | 6/2006 | Hoffman | |
| 7,067,195 B2 | 6/2006 | Hoffman et al. | |
| 7,091,110 B2 | 8/2006 | Ohnuma | |
| 7,160,779 B2 | 1/2007 | Doczy et al. | |
| 7,279,413 B2 | 10/2007 | Park et al. | |
| 7,297,630 B2 | 11/2007 | Kim | |
| 7,306,982 B2 | 12/2007 | Yamazaki et al. | |
| 7,374,976 B2 | 5/2008 | Maekawa et al. | |
| 7,393,733 B2 | 7/2008 | Currie | |
| 7,459,379 B2 | 12/2008 | Kokubo et al. | |
| 7,485,526 B2 | 2/2009 | Mouli et al. | |
| 7,498,247 B2 | 3/2009 | Ahn et al. | |
| 7,585,756 B2 | 9/2009 | Nam et al. | |
| 7,611,972 B2 | 11/2009 | Govindarajan | |
| 7,612,403 B2 | 11/2009 | Bhattacharyya | |
| 7,635,628 B2 | 12/2009 | Khang et al. | |
| 7,670,641 B2 | 3/2010 | Hoffman et al. | |
| 7,683,418 B2 | 3/2010 | Park et al. | |
| 7,718,479 B2 | 5/2010 | Kavalieros et al. | |
| 7,745,890 B2 | 6/2010 | Yu et al. | |
| 7,758,915 B2 | 7/2010 | Hoffman | |
| 7,858,459 B2 | 12/2010 | Ramin et al. | |
| 7,936,025 B2 | 5/2011 | Chau et al. | |
| 7,968,956 B2 | 6/2011 | Tatsumura et al. | |
| 7,989,094 B2 | 8/2011 | Krisko et al. | |
| 8,329,563 B2 | 12/2012 | Minato et al. | |
| 8,460,519 B2 | 6/2013 | Ye et al. | |
| 8,501,626 B2 | 8/2013 | Liu et al. | |
| 8,679,962 B2 | 3/2014 | Hou et al. | |
| 2002/0030283 A1 | 3/2002 | Itabashi et al. | |
| 2002/0155658 A1 | 10/2002 | Al-Shareef et al. | |
| 2002/0187624 A1 | 12/2002 | Min | |
| 2002/0197935 A1 | 12/2002 | Mueller et al. | |
| 2003/0151074 A1 | 8/2003 | Zheng et al. | |
| 2003/0183915 A1 | 10/2003 | Scheifers et al. | |
| 2004/0152240 A1 | 8/2004 | Dangelo | |
| 2005/0282341 A1 | 12/2005 | Park | |
| 2006/0189156 A1 | 8/2006 | Doczy et al. | |
| 2006/0264066 A1 | 11/2006 | Bartholomew et al. | |
| 2006/0267113 A1 | 11/2006 | Tobin et al. | |
| 2006/0289948 A1 | 12/2006 | Brown et al. | |
| 2007/0059910 A1 | 3/2007 | Pei et al. | |
| 2008/0001202 A1* | 1/2008 | Schaeffer | H01L 29/4966 257/E21.703 |
| 2008/0023778 A1 | 1/2008 | Henson et al. | |
| 2008/0183235 A1 | 7/2008 | Stancer et al. | |
| 2008/0191286 A1* | 8/2008 | Chang | H01L 21/823842 257/E21.639 |
| 2008/0237728 A1* | 10/2008 | Mitsuhashi | H01L 29/4966 257/E21.294 |
| 2009/0057750 A1 | 3/2009 | Takashima et al. | |
| 2009/0152651 A1 | 6/2009 | Bu et al. | |
| 2009/0152654 A1 | 6/2009 | Classen et al. | |

OTHER PUBLICATIONS

Chinese Patent Office, Office Action dated Aug. 4, 2010, Application No. 200910141835.8, 6 pages.

Hong et al "TaCx Thin Films Prepared by Atomic Layer Deposition as Diffusion Barriers for Cu Metallization", J. Am. Ceram. Soc., 97 [1] 127-134 (2014).

Kim, Hyoungsub, et al., "Engineering chemically abrupt high-k metal oxide/silicon interfaces using an oxygen-gettering metal overlayer," Journal of Applied Physics vol. 96, No. 6, Sep. 15, 2004, 6 pages.

* cited by examiner

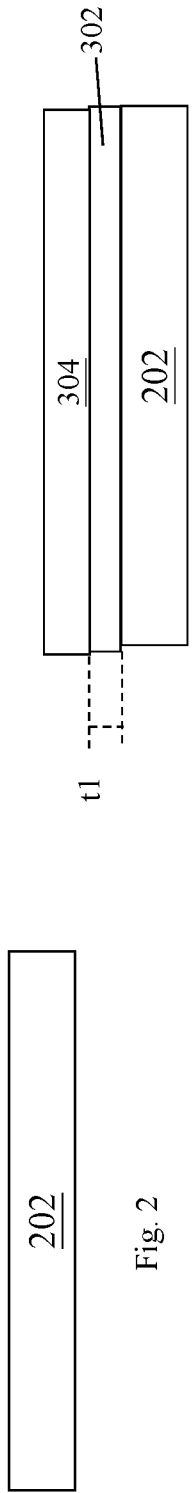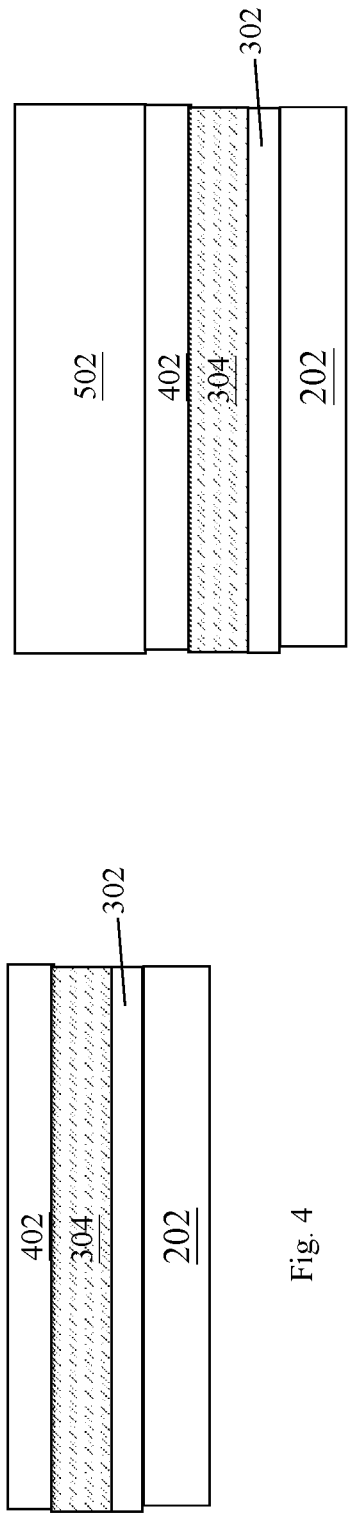

INTEGRATED CIRCUIT METAL GATE STRUCTURE AND METHOD OF FABRICATING THEREOF

CROSS-REFERENCE

This application is a continuation application of U.S. patent application Ser. No. 16/219,546 issuing as U.S. Pat. No. 11,004,950, which is a continuation of U.S. patent application Ser. No. 14/103,550, filed Dec. 11, 2013, now U.S. Pat. No. 10,164,045, which is a divisional application of U.S. patent application Ser. No. 12/264,822, filed on Nov. 4, 2008, now U.S. Pat. No. 8,679,962, which claims the priority under 35 U.S.C. § 119 of U.S. Provisional Application 61/090,674 filed Aug. 21, 2008, the entire disclosures of which are incorporated by reference. The present disclosure is related to commonly-assigned U.S. Patent Provisional Application No. 61/091,664, filed Aug. 25, 2008 for "Semiconductor Device Gate Structure Including A Gettering Layer", the entire disclosure of which is incorporated herein by reference.

BACKGROUND

The present disclosure relates generally an integrated circuit device and, more particularly, a gate structure of a semiconductor device.

As technology nodes decrease, semiconductor fabrication processes have introduced the use of gate dielectric materials having a high dielectric constant (e.g., high-k dielectrics). The high-k dielectrics exhibit a higher dielectric constant than the traditionally used silicon dioxide, which allows for thicker dielectric layers to be used to obtain similar equivalent oxide thicknesses (EOTs). The processes also benefit from the introduction of metal gate structures providing a lower resistance than the traditional polysilicon gate structures.

In particular as gate lengths decrease, minimization of equivalent oxide thickness (EOT) becomes more critical. However, an interfacial layer may be required between the gate dielectric layer (e.g., $HfO_2$) and the silicon substrate. The interfacial layer also contributes to the EOT of the gate structure. Therefore, as the scale of gate lengths decrease, the thickness of the interfacial layer becomes more critical. It is also desirable to increase the dielectric constant of the gate dielectric to control the EOT of the gate structure. Further, it is desirable to cure oxygen vacancies in the gate dielectric layer.

Therefore, what is needed is an improved gate structure and fabrication method.

SUMMARY

In an embodiment, a semiconductor device is provided. The device includes a gate dielectric layer and a gate electrode formed on the gate dielectric layer. The gate electrode includes a first metal layer, a second metal layer, and a third metal layer. The first metal layer includes an oxygen-gettering composition. The second metal layer includes oxygen. The third metal layer includes an interface with a polysilicon layer.

BRIEF DESCRIPTION OF THE DRAWINGS

FIGS. 2-6 are cross-sectional views of a semiconductor device corresponding to the steps of an embodiment of the method of FIG. 1.

DETAILED DESCRIPTION

Figure 1:
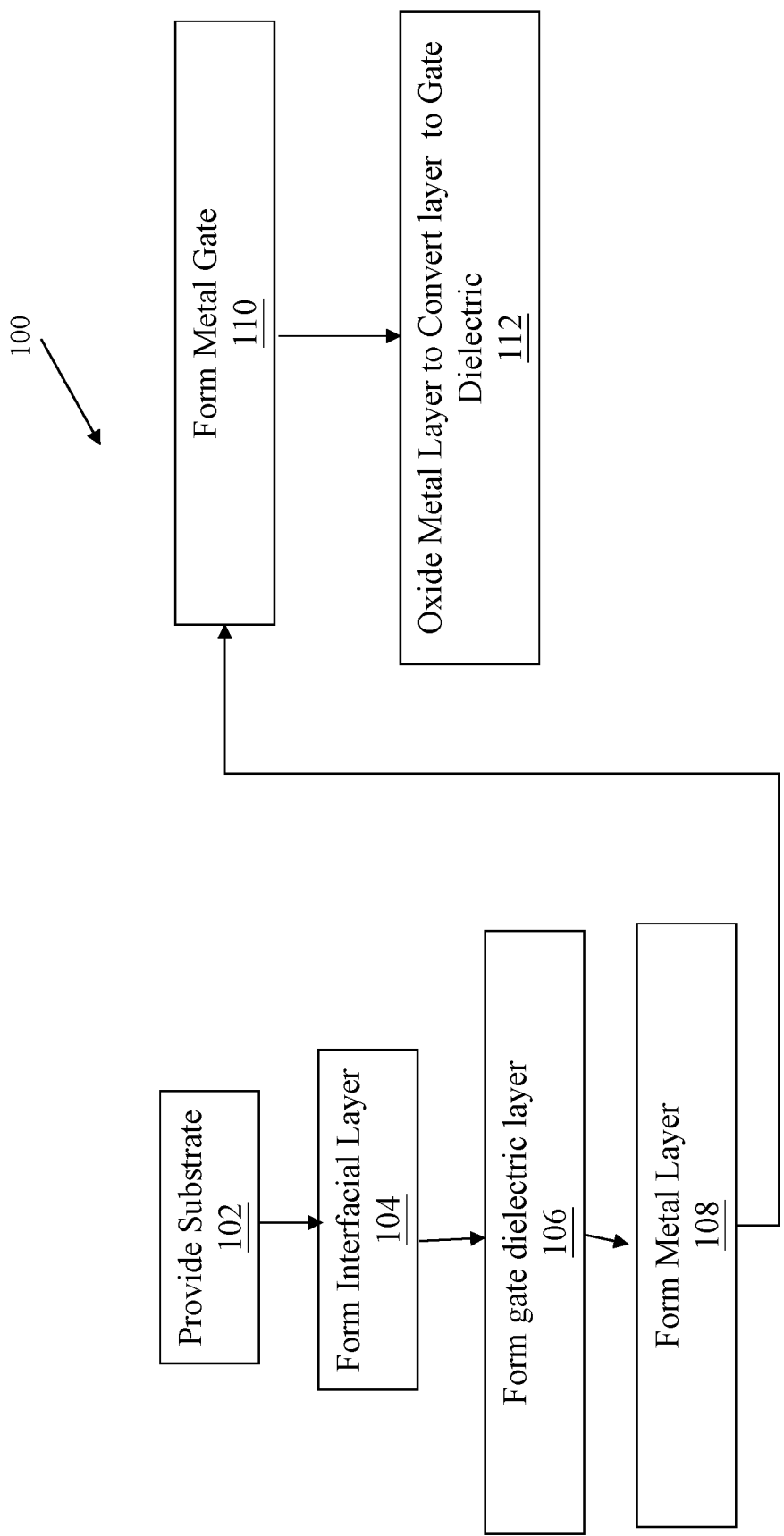
FIG. 1 is a flowchart illustrating an embodiment of a method of forming a gate structure including a high-k gate dielectric.
Figure 6:
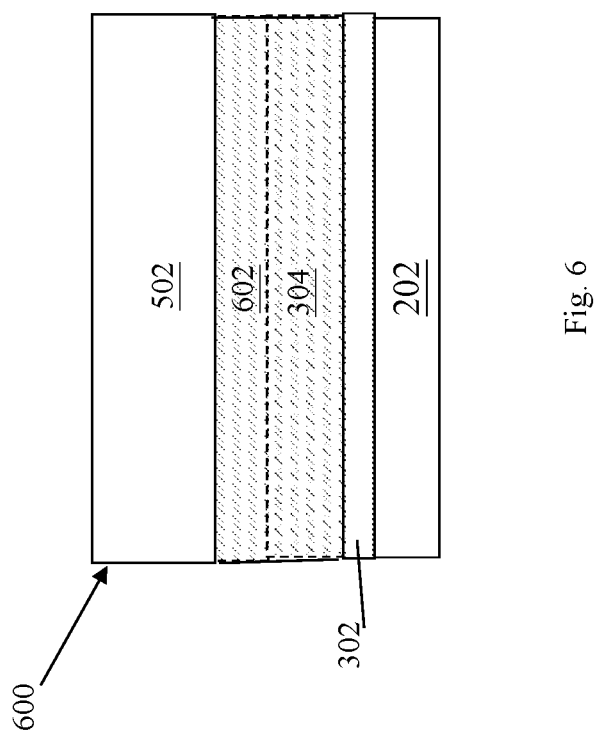

The present disclosure relates generally to forming an integrated circuit device on a substrate and, more particularly, to fabricating a gate structure of a semiconductor device (e.g., FET device). It is understood, however, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Furthermore, descriptions of a first layer "on," "overlying," (and like descriptions) a second layer include embodiments where the first and second layer are in direct contact and those where one or more layers are interposing the first and second layer.

Referring to FIG. 1, illustrated is a flowchart providing an embodiment of a method 100 of forming a gate structure. FIGS. 2-6 provide exemplary devices corresponding to the fabrication steps of FIG. 1. The method 100 may be included during processing of a semiconductor device, or portion thereof, that may comprise static random access memory (SRAM) and/or other logic circuits, passive components such as resistors, capacitors, and inductors, and active components such as P-channel field effect transistors (PFET), N-channel FET (NFET), metal-oxide semiconductor field effect transistors (MOSFET), complementary metal-oxide semiconductor (CMOS) transistors, bipolar transistors, high voltage transistors, high frequency transistors, other memory cells, and combinations thereof.

The method 100 begins at step 102 where a substrate (e.g., wafer) is provided. In the example of FIG. 2, a substrate 202 is provided. In an embodiment, the substrate 202 includes a silicon substrate in crystalline structure. The substrate 202 may include various doping configurations depending on design requirements as is known in the art (e.g., p-type substrate or n-type substrate). Other examples of the substrate 202 may also include other elementary semiconductors such as germanium and diamond.

Alternatively, the substrate 202 may include a compound semiconductor such as, silicon carbide, gallium arsenide, indium arsenide, or indium phosphide. Further, the substrate 202 may optionally include an epitaxial layer (epi layer), may be strained for performance enhancement, and/or may include a silicon-on-insulator (SOI) structure. Further still, the substrate 202 may include a plurality of features formed thereon, including active regions, isolation regions, source/drain regions, isolation features (e.g., shallow trench isolation features), and/or other features known in the art.

The method 100 then proceeds to step 104 where an interfacial layer is formed on the substrate. In the example of FIG. 3, an interfacial layer 302 is formed on the substrate 202. The interfacial layer 302 may include silicon, oxygen, and/or nitrogen. In an embodiment, the interfacial layer 302 includes $SiO_2$. The interfacial layer 302 may be formed by atomic layer deposition (ALD), wet cleaning, thermal oxidation, and/or other suitable process. In an embodiment, the interfacial layer 302 thickness t1 is approximately 8 Angstroms.

The method 100 then proceeds to step 106 where a gate dielectric layer is formed on the substrate. The gate dielectric layer may be formed on the interfacial layer. In an embodiment, gate dielectric layer includes a high-k (high dielectric constant) material. In the example of FIG. 3, a gate dielectric layer 304 is formed on the substrate 202. The gate dielectric layer 304 includes a high-k dielectric material. In an embodiment, the high-k dielectric material is hafnium oxide ($HfO_2$). Other examples of high-k dielectrics include hafnium silicon oxide (HfSiO), hafnium silicon oxynitride (HfSiON), hafnium tantalum oxide (HfTaO), hafnium titanium oxide (HfTiO), hafnium zirconium oxide (HfZrO), combinations thereof, and/or other suitable materials. In an embodiment, the gate dielectric layer 304 includes $HfO_2$ and has a k-value of approximately 20. In embodiments, additional layers, such as capping layers and/or buffer layers, may be formed over the interfacial layer 302, overlying and/or underlying the gate dielectric layer 304. Example capping layer compositions include LaOx, AlOx, MgOx, and/or other suitable metal oxide compositions. The gate dielectric layer 304 may be fabricated using ALD, CVD, PVD, and/or other suitable processes.

The method 100 then proceeds to step 108 where a metal layer is formed on the substrate overlying the interfacial layer. Referring to the example of FIG. 4, the metal layer 402 is formed. The metal composition of the metal layer 402 may include elemental metal or metal-rich nitride. The metal layer 402 includes a composition that can getter oxygen (for example, from the interfacial layer) and/or is easily oxidizable. The composition of the metal layer 402 may be selected such that it, when oxidized, provides a layer having a high dielectric constant such as described below with reference to step 112. Examples include Ti, Ta, Hf, Zr, W, TiN, TaN, and other suitable metals. The metal layer 402 may include a thickness between approximately 2 and 20 angstroms. The metal layer 402 may be formed using processes such as physical vapor deposition (PVD), atomic layer deposition (ALD), metal oxide chemical vapor deposition (MOCVD), and/or other suitable processes.

Oxygen from the interfacial layer 302 may be gettered by the metal layer 402 as the metal layer 402 is being deposited. This may result in a thinner interfacial layer and/or suppress interfacial layer growth that may occur, for example, during high temperature processing (e.g., deposition of the metal layer 402). Oxygen may be gettered from other layers, for example, gate dielectric layer and/or capping layers, in addition to or in lieu of oxygen from the interfacial layer. The gettering of oxygen may contribute to the conversion of the metal layer into metal oxide layer, described below with reference to step 112.

The method 100 then proceeds to step 110 where a metal gate is formed. The formation of the metal gate includes providing a work function metal. In an embodiment, the metal gate or portion thereof (e.g., the work function layer) is deposited in-situ (e.g., formed immediately following the formation of the first metal layer without physical transfer of the substrate, for example, to another location, tool, or chamber) with the metal layer, described above with reference to step 108. In-situ deposition of the metal gate reduces and/or eliminates oxidation of the metal layer (e.g., such that it remains an oxygen-gettering composition). Referring to the example of FIG. 5, the metal gate 502 is formed on the metal layer 402. The metal gate 502 may be fabricated by PVD, ALD, CVD, plating, and/or other suitable processes. The metal gate 502 may include a single metal layer, a dual metal gate, include capping layers, and/or other suitable metal gate structures known in the art. The metal gate 502 may include one or more layers including Ti, TiN, TaN, Ta, TaC. TaSiN. W. WN, MON, MOON, $RuO_2$, and/or other suitable materials. Examples of metals that may be deposited include p-type metal materials and n-type metal materials. P-type metal materials include compositions such as ruthenium, palladium, platinum, cobalt, nickel, and conductive metal oxides, and/or other suitable materials. N-type metal materials include compositions such as hafnium, zirconium, titanium, tantalum, aluminum, metal carbides (e.g., hafnium carbide, zirconium carbide, titanium carbide, aluminum carbide), aluminides, and/or other suitable materials. Other materials may deposited in addition to the work function metals (e.g., fill metals) and may include titanium nitride, tungsten, titanium, aluminum, tantalum, tantalum nitride, cobalt, copper, nickel, and/or other suitable materials. In an embodiment, the metal gate 502, or portion thereof, is formed in-situ with the metal layer 402.

The method 100 then proceeds to step 112 where the metal layer formed in step 108 is converted to a gate dielectric layer. Referring to the example of FIG. 6, the metal oxide layer 602 is formed (converted from the metal layer 402, described above with reference to FIG. 4). The metal oxide layer 602 provides a gate dielectric layer for the gate structure 600. In other words, the metal oxide layer 602 and the gate dielectric layer 304 together provide the gate dielectric for the gate structure 600. Thus, the equivalent oxide thickness (EOT) for the structure 600 is determined by the combination of the metal oxide layer 602 and the gate dielectric layer 304 (as well as any interfacial layer 302). The metal oxide layer 602 and the gate dielectric layer 304 may be homogenous or gradient in structure. In an embodiment, the metal oxide layer 602 may provide a greater k value than the gate dielectric layer 304, for example, may provide a dielectric constant greater than that of $HfO_2$. Examples of such metal oxides include $TiO_2$ and $Ta_2O_5$.

The following description provides various processes that may be used in the fabrication of the metal oxide layer 602 (e.g., conversion of the metal layer 402). However, the descriptions are exemplary only, and not intended to be limiting in any manner. One or more of the described processes may be used in conjunction.

In an embodiment, the metal layer 402 is oxidized prior to the formation of the metal gate, described above with reference to step 110. Oxidation may be performed to transform the metal layer 402 to a metal-rich oxide or oxynitride. The oxidation may include a high temperature anneal in an oxygen-containing ambient environment, a low temperature/high pressure introduction of $O_2/N_2$ gases, and/or other suitable processes.

In an embodiment, oxidation of the metal layer 402 may be performed after the metal gate, or portion thereof, is formed. Oxidation may be performed to transform the metal layer 402 to a metal-rich oxide or oxynitride. The oxidation may include a high temperature anneal in an oxygen-containing ambient environment, a low temperature/high pressure introduction of $O_2/N_2$ gases, and/or other suitable processes.

A high temperature process such as an anneal may be used to convert the metal layer 402 into the metal oxide layer 602.

In an embodiment, a rapid thermal anneal process is used to activate the source/drain regions associated with the gate structure. The process may further provide the benefit of converting the metal layer 402 into the metal oxide layer 602.

During an elevated temperature process, such as the source/drain activation anneal, the metal layer 402 may also absorb (e.g., getter) oxygen released from the interfacial layer 302 and/or the gate dielectric layer 304. The gettering of oxygen from other layers of the gate structure, may reduce the thickness, for example, of the interfacial layer 302, such that EOT is reduced.

The metal oxide layer 602 acts as a gate dielectric layer of the gate structure 600. In an embodiment, the metal oxide layer 602 is substantially homogenous with the gate dielectric layer 304. In an embodiment, the metal oxide layer 602 and the gate dielectric layer 304 form a gradient gate dielectric structure. The metal oxide layer 602 may include oxides or oxinitrides of Ti, Ta, Hf, Zr, W, and/or other suitable metals. The dielectric constant (k-value) of the formed gate dielectric is determined by the selected metal layer 402 composition, described above with reference to step 108. In an embodiment, the k-value of the formed metal oxide gate dielectric may be greater than the k-value of the originally deposited gate dielectric layer, described above with reference to step 106.

In embodiments, the method 100 may continue to include further processing steps such as formation of interconnects, contacts, capping layers, and/or other suitable features. The method 100 may be included in a "gate last" process where the metal gate structure described herein is formed in a trench. The trench being formed by the removal of a dummy gate structure (e.g., sacrificial polysilicon gate). Alternatively, the method 100 may be included in a "gate first" process.

Figure 7:
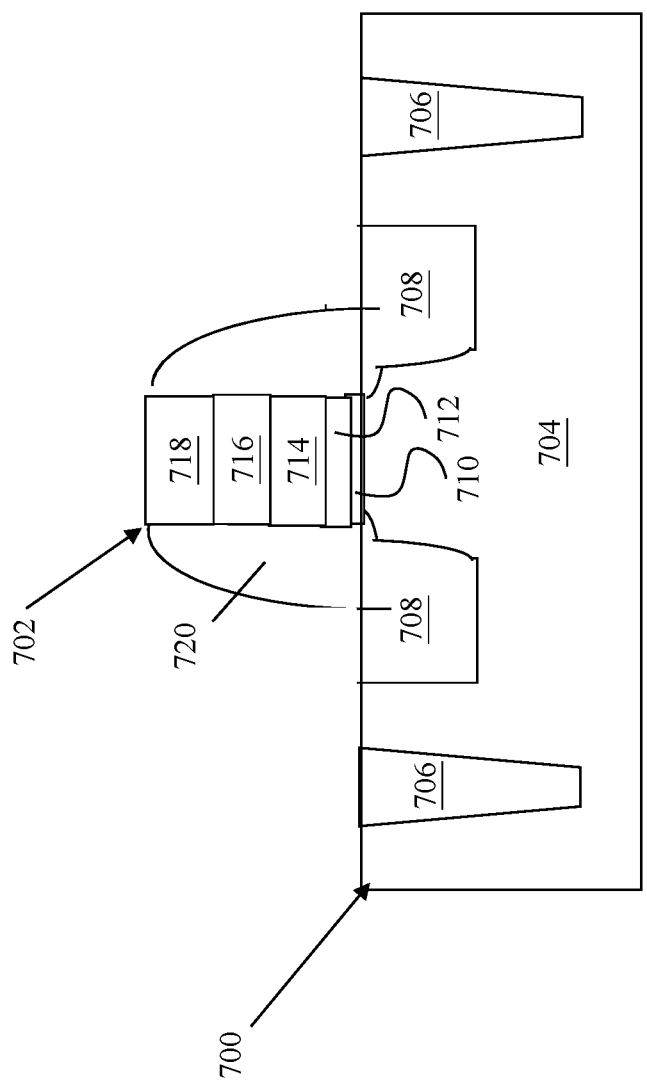
FIG. 7 is a cross-sectional view of a semiconductor device including a multiple-layer metal gate structure.

Referring now to FIG. 7, illustrated is a portion of a semiconductor device 700. The device 700 may comprise static random access memory (SRAM) and/or other logic circuits, passive components such as resistors, capacitors, and inductors, and active components such as P-channel field effect transistors (PFET), N-channel FET (NFET), metal-oxide semiconductor field effect transistors (MOSFET), complementary metal-oxide semiconductor (CMOS) transistors, bipolar transistors, high voltage transistors, high frequency transistors, other memory cells, and combinations thereof. The semiconductor device 700 includes a gate structure 702 which includes multi-layer metal gate (e.g., metal layers 714, 716, and 718 described below).

The semiconductor device 700 includes a substrate 704. The substrate 704 may be substantially similar to the substrate 202, described above with reference to FIG. 2. A plurality of shallow trench isolation (STI) structures 706 are formed on the substrate to isolate one or more devices (e.g., transistors) from each other. The STI structures 706 may include silicon oxide, silicon nitride, silicon oxynitride, fluoride-doped silicate glass (FSG), and/or a low k dielectric material. Other isolation methods and/or features are possible in lieu of or in addition to STI features. The STI features 706 may be formed using processes such as reactive ion etch (RIE) of the substrate 704 to form trenches which are then filled with insulator material using deposition processes, followed by a CMP process.

Source/drain regions 708 including lightly doped source/drain regions and heavy doped source/drain regions, are disposed on the substrate 704 adjacent to (and associated with) the gate structure 702 of the semiconductor device 700. The source/drain regions 708 may be formed by implanting p-type or n-type dopants or impurities into the substrate 704 depending on the desired transistor configuration. The source/drain features 708 may be formed by methods including photolithography, ion implantation, diffusion, and/or other suitable processes.

Spacers 720 are formed on the sidewalls of the gate structure 702 of the semiconductor device 700. The spacers 720 may be formed of silicon oxide, silicon nitride, silicon oxynitride, silicon carbide, fluoride-doped silicate glass (FSG), a low k dielectric material, combinations thereof, and/or other suitable material. The spacers 720 may have a multiple layer structure, for example, including one or more liner layers. The liner layers may include a dielectric material such as silicon oxide, silicon nitride, and/or other suitable materials. The spacers 720 may be formed by methods including deposition of suitable dielectric material and anisotropically etching the material to form the spacer 720 profile.

The gate structure 702 of the semiconductor device 700 includes an interfacial layer 710, a gate dielectric 712, and a metal gate, which includes a first metal gate layer 714, a second metal gate layer 716, and a third metal gate layer 718. The interfacial layer 710 may be substantially similar to the interfacial layer 302, described above with reference to FIG. 3. The gate dielectric 712 may be substantially similar to the gate dielectric 304, described above with reference to FIG. 3. The gate structure 702 may include additional layers, such as capping layers.

The first metal layer 714 of the metal gate includes an oxygen-gettering composition. The first metal layer 714 may getter oxygen from the interface layer 710. The gettering may allow for reduction of the interfacial layer 710 thickness and/or restriction of the growth of the interfacial layer 710 during subsequent processing (e.g., high temperature processing). Examples of oxygen-gettering compositions include metal-rich nitrides such as Ti-rich TiN or TiSiN, metal-rich carbides such as Ta-rich TaC, and/or other suitable compositions. In an embodiment, the thickness of the first metal layer 714 is between approximately 1 and 5 nanometers. In an embodiment, the thickness of the first metal layer 714 is between approximately 5 and 50 Angstroms. The first metal layer 714 is formed using processes such as PVD, ALD, MOCVD, and/or other suitable processes.

The second metal layer 716 includes a composition that provides for easy oxidation and/or oxygen diffusion. The second metal layer 716 may include an oxygen-containing metal layer. In an embodiment, the second metal layer 716, as deposited, includes an oxidizable-metal composition. Examples of preferred suitable compositions include carbon-rich TaC, TaCO, TaCNO, and other suitable compositions. Examples of compositions further include TaN, oxygen containing metals such as, TiON, MoON, and/or other suitable compositions. In an embodiment, the thickness of the second metal layer 716 is between approximately 1 and 5 nanometers. In an embodiment, the thickness of the second metal layer 716 is between approximately 5 and 50 Angstroms. The second metal layer 716 may be formed using processes such as PVD, ALD, MOCVD, and/or other suitable processes. In an embodiment, an elemental metal or metal nitride layer is formed. An oxidation is then performed to form the oxygen-containing second metal layer 716. The oxidation may include an anneal in an oxygen atmosphere, a plasma treatment including an $O_2$ plasma, a low temperature anneal under high pressure with a $O_2/N_2$ atmosphere, and/or other suitable processes. In an embodiment, an $O_2$ plasma treatment is performed at a temperature of ambient to 300C. In an embodiment, a low temperature anneal under high pressure is performed using a temperature of 500-800C. The $O_2/N_2$ may be tuned from pure $O_2$ to $O_2/N_2$ partial pressure ratio of approximately 1%.

The third metal layer 718 includes a composition that is compatible with polysilicon. In an embodiment, a polysilicon capping layer is formed on the third metal layer 718. The third metal layer 718 may include a composition such that it is resistant to oxidation and/or provides a low surface roughness. Examples of suitable compositions include N-rich TiN, TaN, carbon-rich TaC, and/or other suitable materials. The third metal layer 718 may be formed using processes such as, PVD, ALD, MOCVD, and/or other suitable processes. In an embodiment, the third metal layer 718 includes a thickness between approximately 1 and 15 nanometers. In an embodiment, the third metal layer 718 includes a thickness between approximately 5 and 50 Angstroms. In an embodiment, a polysilicon layer is formed on the third metal layer 718 and no silicide is formed between the interface of the two layers.

Thus, the first metal layer 714 may getter oxygen from the interfacial layer 710. The gettering of the oxygen may reduce the thickness and/or restrict the growth of the interfacial layer 710. The second metal layer 716 may provide oxygen to the gate dielectric layer 714. Thus, the multi-layer gate structure allows for incorporating oxygen into the gate dielectric layer 712 to repair oxygen vacancy which, for example, controls the threshold voltage of the PMOS device and controls the EOT.

The device 700 may be fabricated using a "gate last" process or a "gate first" process. The device 700 may be formed using the method 800 or portion thereof, described below with reference to FIG. 8. Other layers may be present on the device 700 including capping layers, buffer layers, metal layers, interconnects, interlayer dielectrics, and/or other known features.

Figure 8:
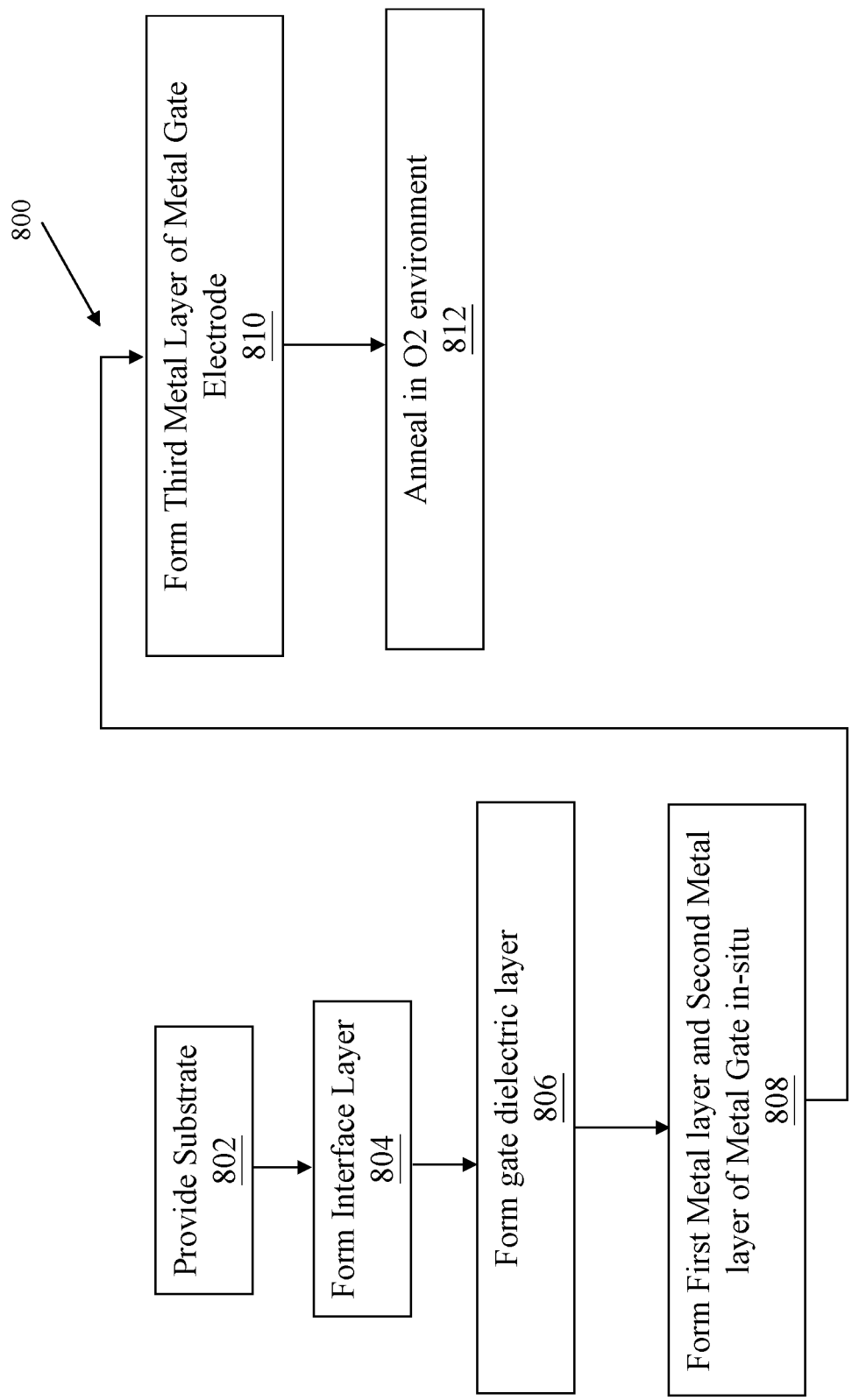
FIG. 8 is a flowchart illustrating an embodiment of a method of fabricating a multiple-layer metal gate.
Figure 10:
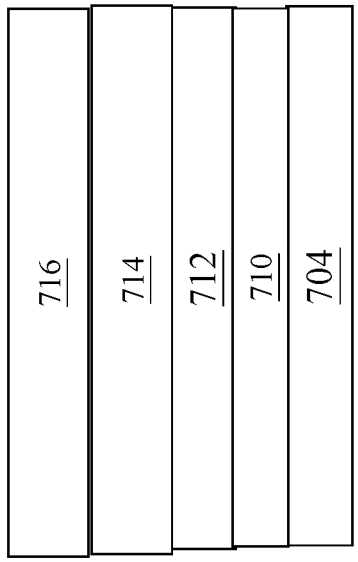
FIGS. 9-11 are cross-sectional views of a semiconductor device corresponding to the steps of an embodiment of the method of FIG. 8.
Figure 9:
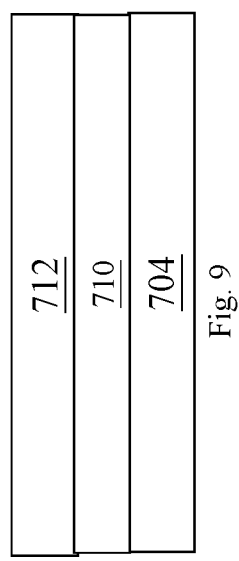
Figure 11:
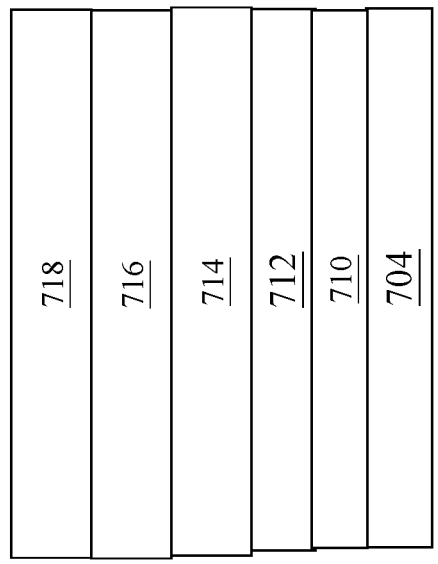

Referring now to FIG. 8, illustrated is a method 800 for fabricating a semiconductor device including a multi-layer metal gate such as, the semiconductor device 700 described above with reference to FIG. 7. FIGS. 9-11 illustrate cross-sectional views of a semiconductor device according to the method 800. The method 800 begins at step 802 where a substrate is provided. The substrate may be substantially similar to the substrate 704, described above with reference to FIG. 7.

The method 800 then proceeds to step 804 where an interface layer is formed on the substrate. The interface layer may include silicon, oxygen, nitrogen, and/or other suitable materials. In an embodiment, the interface layer includes $SiO_2$. The interface layer may be formed by ALD, wet cleaning, oxidation, $O_3$ treatment, and/or other suitable processes. The layer may be substantially similar to the interfacial layer 710, described above with reference to FIG. 7. The method 800 then proceeds to step 806 where a gate dielectric layer is formed. The gate dielectric layer may include a high-k dielectric material. The gate dielectric layer may be substantially similar to the gate dielectric layer 712, described above with reference to FIG. 7. In an embodiment, one or more additional layers may be formed in step 806 such as, capping layers underlying or overlying the gate dielectric.

The method 800 then proceeds to step 808 where a first metal layer and a second metal layer of the multi-layer metal gate are formed. The first metal layer includes a composition having an oxygen-gettering effect. The first metal layer may be substantially similar to the first metal layer 714, described above with reference to FIG. 7. The second metal layer may include an oxygen-containing metal composition (e.g, as deposited or after oxidation as described below). In an embodiment, the second metal layer is substantially similar to the second metal layer 716, described above with reference to FIG. 7. The first and second metal layer may be formed in any sequence, for example, the second underlying the first metal layer.

In an embodiment, the first metal layer and the second metal layer are formed in-situ (e.g., a second metal layer is formed immediately following the formation of a first metal layer without physical transfer of the substrate, for example, to another location, tool, or chamber). The in-situ processing may be preferred to prevent uncontrolled oxidation of the first metal layer. This allows for subsequent incorporation of oxygen in a controlled manner (e.g., gettered from an interfacial layer). In an alternative embodiment, the first metal layer and the second metal layer are formed ex-situ.

The first and second metal layers may be formed by PVD, ALD, MOCVD, and/or other processes known in the art. In an embodiment, the formation of the second metal layer includes an oxidation process. For example, a layer of elemental metal or metal nitride may be formed on the first metal layer. This elemental metal or metal nitride layer is then oxidized to form the second metal layer of an oxygen-containing metal composition. Processes used to oxidize the metal include annealing in an $O_2$ atmosphere, $O_2$ plasma treatment, a low temperature/high pressure $O_2/N_2$ anneal, and/or other suitable processes.

The first metal layer may getter oxygen from the interface layer. It is desirable to control the thickness of the interface layer in order to reduce the equivalent oxide thickness (EOT) of the transistor. The interface layer thickness, after deposition, may increase during subsequent fabrication processes (e.g., exposure to high temperature). The gettering of oxygen from the interface layer may reduce the thickness of the interface layer and/or restrict the growth of the interface layer. The gettering of the oxygen may contribute to an increased thickness of the first metal layer and/or the oxidation of the first metal layer.

The second metal layer, an oxygen-rich layer, may serve to transfer oxygen to the gate dielectric layer. The transferred oxygen may repair oxygen vacancies in the gate dielectric layer that are created during subsequent processing (e.g., rapid thermal anneal). Oxygen vacancies can induce a high threshold voltage of a PMOS device, enhance trapping and positive bias temperature instability (PBTI) of a MOS transistor.

The method 800 then proceeds to step 810 where a third metal layer of the multi-layer metal gate is formed. The third metal layer may be substantially similar to the third metal layer 718, described above with reference to FIG. 7. The third metal layer may be formed by PVD, ALD, MOCVD, and/or other suitable processes. In an embodiment, the third metal layer and the second metal layer are formed in-situ. In an alternative embodiment, the third metal layer and the second metal layer are formed ex-situ. The third metal may provide an effective interface with an overlying layer such as, a polysilicon layer.

The method 800 then proceeds to step 812 where an anneal is performed. The anneal may be performed in an oxygen environment. The anneal process may include high temperature anneal, or a low temperature high pressure (e.g., 20atm) anneal. The anneal may serve to incorporate oxygen into the gate dielectric layer and/or the second metal layer. The incorporation of oxygen can reduce the oxygen vacancies as described above with reference to step 810. In an embodiment, step 812 is omitted from the method 800.

While the preceding description shows and describes one or more embodiments, it will be understood by those skilled in the art that various changes in form and detail may be made therein without departing from the spirit and scope of the present disclosure. Therefore, the claims should be interpreted in a broad manner, consistent with the present disclosure.

What is claimed is:

1. A method of fabricating a gate for a semiconductor device, comprising:
   depositing a gate dielectric layer;
   forming a gate electrode on the gate dielectric layer, wherein the forming the gate electrode includes:
   depositing a first layer over the gate dielectric layer, wherein the depositing the first layer includes depositing one of titanium nitride (TiN), titanium silicon nitride (TiSiN), or tantalum carbide (TaC);
   depositing a second layer includes depositing a first composition selected from the group consisting of titanium oxynitride (TION), oxidized carbon tantalum (TaCO), oxidized tantalum carbonitride (TaCNO), and combinations thereof, wherein the first layer and the second layer share a first physical interface between the first composition of the second layer and the first layer, and wherein the second layer is directly on and directly contacting the gate dielectric layer such that the first composition physically touches the gate dielectric layer to form a second interface between the first composition of the second layer and the gate dielectric layer;
   diffusing oxygen from the second layer to the gate dielectric layer through the interface; and
   after the diffusing, depositing a third layer over the first layer and the second layer, wherein the depositing the third layer includes depositing a nitride of one of tantalum or titanium, wherein the first layer, the second layer, and the third layer form a stack of the gate electrode; and
   forming gate spacers abutting the stack of the gate electrode.

2. The method of claim 1, wherein the depositing the third layer includes depositing TaN.

3. The method of claim 1, wherein the depositing the third layer includes depositing TiN.

4. The method of claim 1, further comprising: the first layer gettering oxygen from the gate dielectric layer.

5. The method of claim 1, wherein the depositing the second layer includes an anneal in an oxygen atmosphere or a plasma treatment including an oxygen plasma.

6. The method of claim 1, wherein the first layer has a bottom surface directly touching a top surface of the second layer.

7. A method of fabricating a gate for a semiconductor device, comprising:
   depositing a gate dielectric layer of a gate structure:
   forming a gate electrode of the gate structure on the gate dielectric layer, wherein the forming the gate electrode includes:
   depositing a first layer over the gate dielectric layer, wherein the depositing the first layer includes depositing a first composition of one of titanium nitride (TiN), titanium silicon nitride (TiSiN), or tantalum carbide (TaC);
   depositing a second layer over the gate dielectric layer, wherein the depositing the second layer includes forming a second composition selected from the group consisting of titanium oxynitride (TION), oxidized carbon tantalum (TaCO), oxidized tantalum carbonitride (TaCNO), and combinations thereof, wherein after the depositing the first layer and the depositing the second layer, the second composition of the second layer directly contacts the first composition of the first layer to form a first interface between the second composition of the second layer and the first layer by depositing the first layer directly on a top surface of the second layer, the first interface extending parallel a top surface of the gate dielectric layer, and wherein after the depositing the second layer, the second composition of the second layer directly contacts a top surface of the gate dielectric layer of the gate structure; and
   depositing a third layer over the first layer and the second layer, wherein the depositing the third layer includes depositing a nitride of one of tantalum or titanium;
   wherein the gate electrode comprises the deposited first layer, the deposited second layer, and the deposited the third layer.

8. The method of claim 7, wherein the depositing the gate dielectric layer includes forming a high-k dielectric composition.

9. The method of claim 8, wherein the depositing the gate dielectric layer further includes forming an interfacial layer under the high-k dielectric composition.

10. The method of claim 9, wherein the interfacial layer is formed by atomic layer deposition (ALD), wet cleaning, or thermal oxidation.

11. The method of claim 7, further comprising: the first layer gettering oxygen from the gate dielectric layer.

12. A method of fabricating a semiconductor device, comprising:
   forming a gate dielectric layer;
   providing a gate electrode on the gate dielectric layer, wherein the providing the gate electrode includes:
   forming a first layer over the gate dielectric layer, wherein the first layer includes one of titanium nitride (TiN), titanium silicon nitride (TiSiN), or tantalum carbide (TaC);
   forming a second layer over the gate dielectric layer, wherein the second layer includes metal and oxygen, wherein the second layer includes a composition selected from the group consisting of titanium oxynitride (TION), oxidized carbon tantalum (TaCO), oxidized tantalum carbonitride (TaCNO), or combinations thereof, wherein the second layer directly contacts the gate dielectric layer, and wherein the first layer and the second layer share an interface; and
   forming a third layer including metal nitride of one of tantalum or titanium vertically over the second layer, wherein the first layer, the second layer, and the third layer form a multi-layer metal gate for a single transistor.

13. The method of claim 12, wherein the forming the second layer is performed directly on an uppermost surface of the gate dielectric layer.

14. The method of claim 12, wherein the forming the first layer is performed directly on an uppermost surface of the second layer.

15. The method of claim 12, wherein the third layer is formed directly on the first layer.

16. The method of claim 12, wherein the second layer when formed directly contacts the gate dielectric layer by physically touching a top surface of the gate dielectric layer.

17. The method of claim 1, wherein the first layer is TiN and the second layer is TION.

18. The method of claim 1, wherein the interface extends a width of the gate electrode.

* * * * *